(12) United States Patent
Ishiguro et al.

(10) Patent No.: US 9,184,241 B2
(45) Date of Patent: Nov. 10, 2015

(54) SEMICONDUCTOR APPARATUS

(71) Applicant: FUJITSU LIMITED, Kawasaki-shi, Kanagawa (JP)

(72) Inventors: Tetsuro Ishiguro, Kawasaki (JP); Atsushi Yamada, Isehara (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/935,945

(22) Filed: Jul. 5, 2013

(65) Prior Publication Data
US 2014/0091314 A1    Apr. 3, 2014

(30) Foreign Application Priority Data

Sep. 28, 2012    (JP) .................................. 2012-218251

(51) Int. Cl.
| | |
|---|---|
| *H01L 29/15* | (2006.01) |
| *H01L 29/20* | (2006.01) |
| *H01L 29/205* | (2006.01) |
| *H01L 29/778* | (2006.01) |
| *H01L 29/66* | (2006.01) |

(52) U.S. Cl.
CPC .......... *H01L 29/2003* (2013.01); *H01L 29/155* (2013.01); *H01L 29/205* (2013.01); *H01L 29/66462* (2013.01); *H01L 29/778* (2013.01); *H01L 29/7787* (2013.01)

(58) Field of Classification Search
CPC . H01L 29/2003; H01L 29/205; H01L 29/778; H01L 29/66462; H01L 29/155; H01L 29/20; H01L 29/7787; H01B 70/1483
USPC ................... 257/12, 13, 85, 90, 94, 183, 196, 257/E29.246, E29.242, E21.403, E21.407, 257/76
See application file for complete search history.

(56) References Cited

U.S. PATENT DOCUMENTS

| | | | |
|---|---|---|---|
| 7,332,031 B2 * | 2/2008 | Tischler et al. .................. | 117/97 |
| 8,283,699 B2 * | 10/2012 | Wu ............................... | 257/192 |
| 2003/0016526 A1 | 1/2003 | Sakai et al. | |
| 2005/0224781 A1 | 10/2005 | Kneissl et al. | |

(Continued)

FOREIGN PATENT DOCUMENTS

| | | |
|---|---|---|
| JP | 2002-359256 | 12/2002 |
| JP | 2007-067077 | 3/2007 |
| JP | 2012-023314 | 2/2012 |

OTHER PUBLICATIONS

TWOA—Office Action mailed on May 25, 2015 issued with respect to the corresponding Taiwanese Patent Application No. 102124504, with partial English translation.

*Primary Examiner* — Yosef Gebreyesus
(74) *Attorney, Agent, or Firm* — Fujitsu Patent Center (57) ABSTRACT

A semiconductor apparatus includes a buffer layer formed on a substrate; an SLS (Strained Layer Supperlattice) buffer layer formed on the buffer layer; an electron transit layer formed on the SLS buffer layer and formed of a semiconductor material; and an electron supply layer formed on the electron transit layer and formed of a semiconductor material. Further, the buffer layer is formed of AlGaN and includes two or more layers with different Al composition ratios, the SLS buffer layer is formed by alternately laminating a first lattice layer including AlN and a second lattice layer including GaN, and the Al composition ratio in one of the layers of the buffer layer being in contact with the SLS buffer layer is greater than or equal to an Al effective composition ratio in the SLS buffer layer.

18 Claims, 11 Drawing Sheets

(56) References Cited

U.S. PATENT DOCUMENTS

| | | | |
|---|---|---|---|
| 2007/0018198 A1* | 1/2007 | Brandes et al. | 257/183 |
| 2008/0157121 A1* | 7/2008 | Ohki | 257/194 |
| 2009/0045438 A1* | 2/2009 | Inoue et al. | 257/192 |
| 2010/0123169 A1* | 5/2010 | Sato | 257/183 |
| 2010/0314663 A1* | 12/2010 | Ito et al. | 257/192 |
| 2011/0049544 A1* | 3/2011 | Komada | 257/97 |
| 2012/0138956 A1* | 6/2012 | Shimizu et al. | 257/77 |
| 2012/0223328 A1* | 9/2012 | Ikuta et al. | 257/76 |
| 2012/0223365 A1* | 9/2012 | Briere | 257/194 |
| 2012/0322245 A1* | 12/2012 | Ohno | 438/478 |
| 2013/0020581 A1* | 1/2013 | Teraguchi et al. | 257/76 |
| 2013/0334495 A1* | 12/2013 | Lim et al. | 257/15 |
| 2014/0091318 A1* | 4/2014 | Ishiguro et al. | 257/76 |

* cited by examiner

SEMICONDUCTOR APPARATUS

CROSS-REFERENCE TO RELATED APPLICATIONS

This application is based upon and claims the benefit of priority of the prior Japanese Patent Application No. 2012-218251, filed on Sep. 28, 2012, the entire contents of which are incorporated herein by reference.

FIELD

The embodiment discussed herein is related to a semiconductor apparatus.

BACKGROUND

A nitride semiconductor such as GaN, AlN, InN and the like and a material of a mixed crystal thereof may have a wide band gap, so as to be used as a high-power electronic device or a short-wavelength light-emitting device. Among these, research and development has been conducted on the technologies of a Field-Effect Transistor (FET) and especially a High Electron Mobility Transistor (HEMT) as a high-power device (see, for example, Japanese Laid-open Patent Publication No. 2002-359256).

The HEMT using such a nitride semiconductor is used in a high-power and highly-efficient amplifier, a high-power switching device and the like.

In the HEMT using such a nitride semiconductor, an aluminum gallium nitride/gallium nitride (AlGaN/GaN) heterostructure is formed on the substrate, so that the GaN layer thereof may serve as an electron transit layer. Further, the substrate may be formed of sapphire, silicon carbide (SiC), gallium nitride (GaN), silicon (Si) or the like.

Among the nitride semiconductors, for example, GaN has excellent electronic characteristics because of its higher withstand-voltage characteristic due to its higher saturated electron speed and wider band gap. Further, GaN has a wurtzite-type crystal structure, so as to have its polarity in <0001> direction which is parallel to the c-axis.

Further, when the AlGaN/GaN heterostructure is formed, in the AlGa layer, a piezoelectric polarization may be excited due to lattice distortion between AlGaN and GaN. Therefore, highly-concentrated Two-Dimensional Electron Gas (2DEG) may be generated near an interface (a boundary surface) of the channel. As a result, the HEMT using GaN is thought to be promising as a high frequency power device.

In the HEMT using the nitride semiconductor, by using a large and inexpensive silicon substrate as the substrate, the cost may be largely reduced. Accordingly, the HEMT using the nitride semiconductor may be provided in lower cost. The silicon substrate is electrically-conductive. Therefore, when such a silicon substrate is used, a nitride layer having higher insulation properties may be formed on the silicon substrate, and a nitride semiconductor layer such as the electron transit layer may be formed on the nitride layer.

However, due to differences in a lattice constant and a coefficient of thermal expansion between silicon and nitride, a bend or a crack is likely to be formed in the substrate or the nitride semiconductor layer. Therefore, it may be difficult to form a thick nitride layer having higher insulation properties. As a result, leakage current in the substrate-gate direction is likely to be increased, and it is difficult to ensure sufficient withstand voltage in the vertical direction (i.e., the thickness direction of the substrate).

As a method of forming a thick nitride layer on the silicon substrate while controlling the generation of the bend or crack, there is a known technique in which a Strained Layer Superlattice (SLS) buffer layer is formed where a GaN-based thin film and an AlN-based thin film are alternately formed in multiple cycles (see, for example, Japanese Laid-open Patent Publication Nos. 2012-23314 and 2007-67077).

In the SLS buffer layer, a thick nitride layer may be formed, while controlling the generation of the bend or crack due to the difference in the lattice constant during the formation of the films, by forming the GaN-based thin film and the AlN-based thin film, each being included in the Superlattice and having a thickness less than or equal to its critical film thickness.

Further, in the SLS buffer layer, by containing a large compression strain in the films of the SLS buffer layer, another large compression strain may be generated across the entity of the nitride layer while the temperature is decreased after the films are formed. As described above, by forming the SLS buffer layer, the thickness of the AlN layer having a wider band gap and higher insulation properties may be increased. As a result, the withstand voltage in the vertical direction may be improved.

SUMMARY

According to an aspect, a semiconductor apparatus includes a substrate; a buffer layer formed on the substrate; an SLS (Strained Layer Supperlattice) buffer layer formed on the buffer layer; an electron transit layer formed on the SLS buffer layer and formed of a semiconductor material; and an electron supply layer formed on the electron transit layer and formed of a semiconductor material. Further, the buffer layer is formed of AlGaN and includes two or more layers with different Al composition ratio, the SLS buffer layer is formed by alternately laminating a first lattice layer including AlN and a second lattice layer including GaN, and the Al composition ratio in one of the layers of the buffer layer being in contact with the SLS buffer layer is greater than or equal to an Al effective composition ratio in the SLS buffer layer.

The objects and advantages of the embodiments disclosed herein will be realized and attained by means of the elements and combinations particularly pointed out in the claims.

It is to be understood that both the foregoing general description and the following detailed description are exemplary and explanatory and are not restrictive of the invention as claimed.

DESCRIPTION OF EMBODIMENT

According to the related art, even when the SLS buffer layer is used, the leakage current may be generated due to the disturbance of the laminated layers in the SLS buffer layer. As a result, a desired withstand voltage may not be obtained. Further, the compression strain may not be contained within the SLS buffer layer. As a result, a bend or a crack may be generated.

To overcome the above problem, as a semiconductor apparatus such as a field-effect transistor using a nitride semiconductor including GaN or the like as a semiconductor material, it is desired to provide a semiconductor apparatus in which a thicker nitride layer can be formed on the substrate and the leakage current in the substrate-gate direction can be reduced.

Embodiments of the present invention are herein described. In the descriptions, the same reference numerals may be repeatedly used to describe the same elements and the like, and the repeated descriptions may be omitted.

First Embodiment

Semiconductor Apparatus

Next, a semiconductor apparatus according to a first embodiment is described. The semiconductor apparatus according to the first embodiment exemplarily described herein is a HEMT having an AlGaN/GaN single heterostructure.

Figure 1:
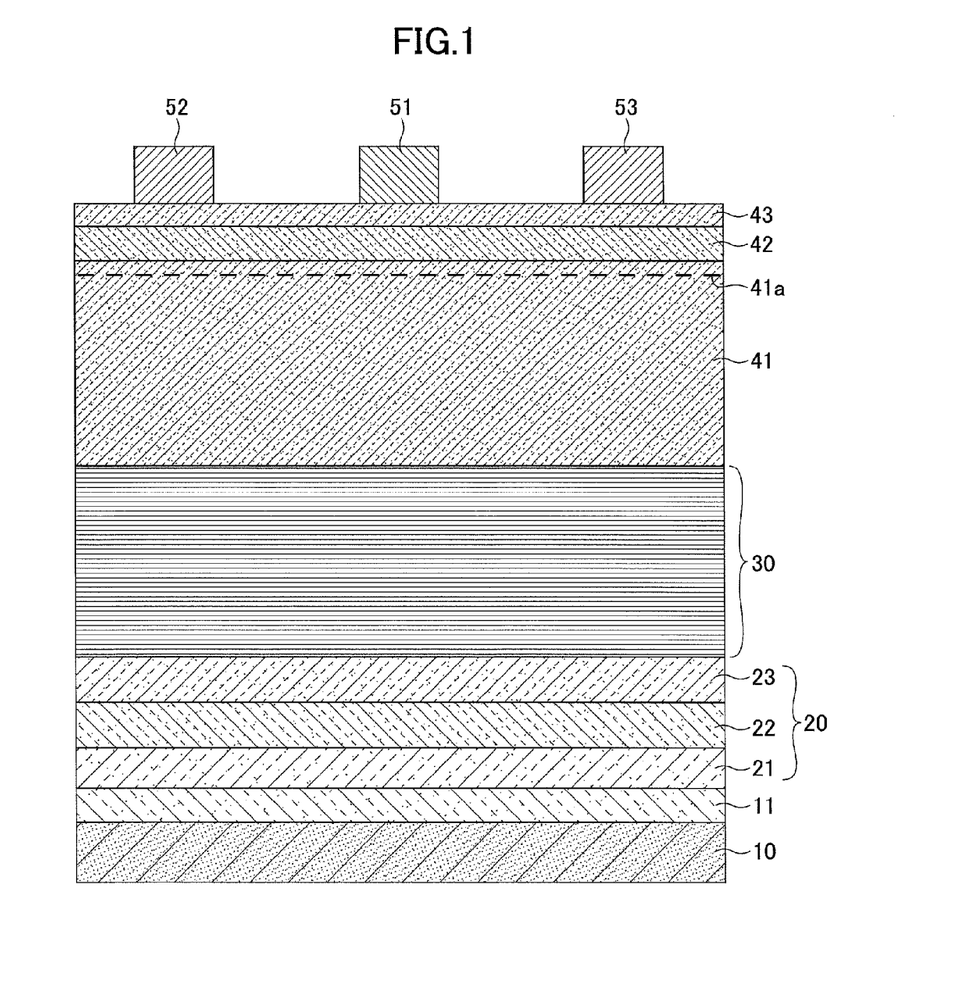
FIG. 1 illustrates an example configuration of a semiconductor apparatus according to a first embodiment of the present invention.

As illustrated in FIG. 1, in the semiconductor apparatus according to the first embodiment, a nucleation layer 11, a first buffer layer 21, a second buffer layer 22, a third buffer layer 23, an SLS buffer layer 30, an electron transit layer 41, an electron supply layer 42, and a cap layer 43 are sequentially formed on a substrate 10.

Further, a gate electrode 51, a source electrode 52, and a drain electrode 53 are formed on the cap layer 43. Further, in this embodiment, the first buffer layer 21, the second buffer layer 22, and the third buffer layer 23 may collectively described as a buffer layer 20.

The substrate 10 may be formed of silicon (Si), silicon carbide (SiC), sapphire, gallium nitride (GaN) or the like. In this embodiment, an Si (111) substrate is used. The nitride layer, which includes the layers from the nucleation layer 11 to the SLS buffer layer 30, the electron transit layer 41, the electron supply layer 42, the a cap layer 43 and the like are formed by Metal Organic Vapor Phase Epitaxy (MOVPE) or Molecular Beam Epitaxy (MBE).

In this embodiment, the MOVPE is used to form the nitride layer from the nucleation layer 11 to the SLS buffer layer 30, the electron transit layer 41, the electron supply layer 42, the cap layer 43 and the like.

The nucleation layer 11 is formed of an AlN layer having a thickness of approximately 200 nm.

In the buffer layer 20, the composition of the first buffer layer 21 is $Al_XGa_{1-X}N$, the composition of the second buffer layer 22 is $Al_YGa_{1-Y}N$, and the composition of the third buffer layer 23 is $Al_ZGa_{1-Z}N$, so that the relationship $1>X>Y>Z>0$ is satisfied.

Specifically, the first buffer layer 21 is formed of $Al_{0.8}Ga_{0.2}N$, the second buffer layer 22 is formed of $Al_{0.5}Ga_{0.5}N$, and the third buffer layer 23 is formed of $Al_{0.3}Ga_{0.7}N$.

As described, the first buffer layer 21, the second buffer layer 22, and the third buffer layer 23 are formed in a manner such that the composition rate of Al is sequentially decreased as the distance to the substrate 10 is increased.

In this embodiment, the term "composition rate of Al" refers to a ratio of (the number of) Al atoms to the sum of (the numbers of) Al atoms and Ga atoms. Also, the values X, Y, and Z refers to the corresponding "composition rates of Al".

Further, the buffer layer 20 is formed so that an accumulated (collective) film thickness of the first buffer layer 21, the second buffer layer 22, and the third buffer layer 23 (i.e. the thickness of the buffer layer 20) is in a range from 500 nm to 1,000 nm. In this embodiment, the buffer layer 20 is formed so that the thickness of the buffer layer 20 is approximately 800 nm.

Figure 2:
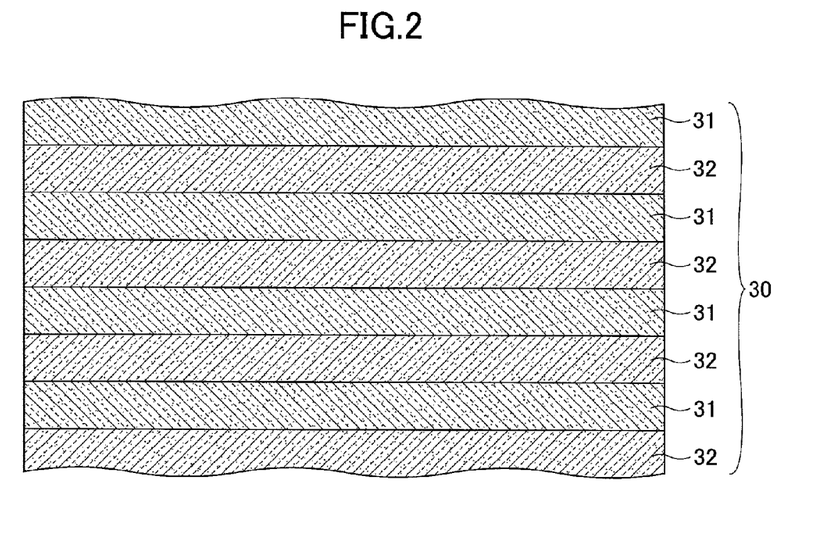
FIG. 2 illustrates an example SLS buffer layer.

As illustrated in FIG. 2, the SLS buffer layer 30 is formed by alternately laminating the AlN layer, which becomes a first lattice layer 31, and the GaN layer which becomes a second lattice layer 32. The lattice constants of AlN in the a-axis and the c-axis are 3.11 Å and 4.98 Å, respectively. The lattice constants of GaN in the a-axis and the c-axis are 3.16 Å and 5.16 Å, respectively. Therefore, the lattice constants of AlN and GaN are different from each other.

In this embodiment, the first lattice layer 31 is formed so as to have a thickness greater than or equal to 0.5 nm and less than or equal to 10 nm. The second lattice layer 32 is formed so as to have a thickness greater than or equal to 10 nm and less than or equal to 40 nm. Further, the first and second lattice layers 31 and 32 are formed so that a ratio of the thickness of the second lattice layer 32 to the thickness of the first lattice layer 31 is greater than or equal to 4 and less than or equal to 20.

Further, a term "Al effective composition ratio" herein refers to an Al composition ratio included in the SLS buffer layer 30 (i.e., a ratio of the number of Al (atoms) to the sum of the numbers of Al and Ga (atoms)). In this embodiment, for convenience purposes, when a ratio of the sum of the thicknesses of the first lattice layer 31 and the second lattice layer 32 to the thickness of the first lattice layer 31 is given as "P", the effective composition of Al the SLS buffer layer 30 may be described (expressed) as "$Al_PGa_{1-P}N$".

In this embodiment, the SLS buffer layer 30 is formed by alternately laminating the AlN layer, which becomes the first lattice layer 31, having a thickness of 5 nm and the GaN layer which becomes the second lattice layer 32, having a thickness of 20 nm for 100 cycles. By doing this, the SLS buffer layer 30 is formed so that the total thickness of the SLS buffer layer 30 is 2,500 nm. Accordingly, the laminated thickness of the AlN layers included in the SLS buffer layer 30 is 500 nm. In this case, the effective composition of Al in the SLS buffer layer 30 is $Al_{0.2}Ga_{0.8}N$, and the Al effective composition ratio in the SLS buffer layer 30 is 0.2.

Further, when the thickness of the SLS buffer layer 30 is too thin, the laminated thickness of the nitride layer having higher insulation properties is thin. When the thickness of the SLS buffer layer 30 is too thick, the substrate may be broken due to the film shrinkage in the SLS buffer layer 30 when the temperature is decreased after the films are formed. Accordingly, it is desired that the thickness of the SLS buffer layer 30 is greater than or equal to 1,000 nm and less than or equal to 3,000 nm.

In this embodiment, the SLS buffer layer 30 is formed in a manner that the Al effective composition ratio in the third buffer layer 23 is greater than or equal to the effective composition of Al in the SLS buffer layer 30 (i.e., Z≥P>0).

Further, the first lattice layer 31 and the second lattice layer 32 may be formed based on different compositions of AlGaN from each other. In this case, when the composition of the first lattice layer 31 is given as "$Al_R Ga_{1-R}N$" and the composition of the second lattice layer 3 is given as "$Al_S Ga_{1-S}N$", the relationship R>S is satisfied.

Further, to control (reduce) the generation of carriers in the SLS buffer layer 30 and increase the resistance of the SLS buffer layer 30, the SLS buffer layer 30 may be doped with an impurity element such as Fe, Mg, C or the like. In this case, it is desired that not the entire SLS buffer layer 30 but only in one of the first lattice layer 31 or the second lattice layer 32 is doped with the impurity element.

Further, in the SLS buffer layer 30, the carrier generation due to the band discontinuity between the first lattice layer 31 and the second lattice layer 32 may occur near the interface of the second lattice layer 32 which becomes the GaN layer having a narrower band gap.

Therefore, it is desired that the entire second lattice layer 32 is doped with an impurity element such as Fe, Mg, C or the like, or a region in the second lattice layer 32 near the interface between the first lattice layer 31 and the second lattice layer 32 is doped with impurity element such as Fe, Mg, C or the like (including any combination thereof).

Further, it is desired that the concentration of the impurity element such as Fe, Mg, C or the like injected (doped) into the SLS buffer layer 30 as described above is in a range from $1\times10^{18}$ cm$^{-3}$ to $1\times10^{20}$ cm$^{-3}$. In this embodiment, as the impurity element, Fe is injected into the SLS buffer layer 30 with a concentration of $1\times10^{19}$ cm$^{-3}$.

The electron transit layer 41 is formed of a GaN layer having a thickness in a range from 500 nm to 1,000 nm. The electron supply layer 42 is formed of an AlGaN layer having a thickness of approximately 20 nm. By doing this, the 2DEG 41a (see FIG. 1) is formed in a region of the electron transit layer 41 near the interface between the electron transit layer 41 and the electron supply layer 42.

Further, the electron supply layer 42 is formed of AlGaN having the Al composition ratio less than or equal to 0.3 so as to avoid the reduction of the crystalline due to lattice mismatch. Further, the cap layer 43 is formed of an n-GaN layer having a thickness of approximately 5 nm.

The gate electrode 51, the source electrode 52, and the drain electrode 53 are formed on the cap layer 43.

In this embodiment, the thickness of the nitride layer including the buffer layer 20, the SLS buffer layer 30 and the like between the substrate 10 and the electron transit layer 41 may be increased. Therefore, the leakage current in the substrate-gate direction may be reduced.

Characteristics of Semiconductor Apparatus and the Like

Figure 3:
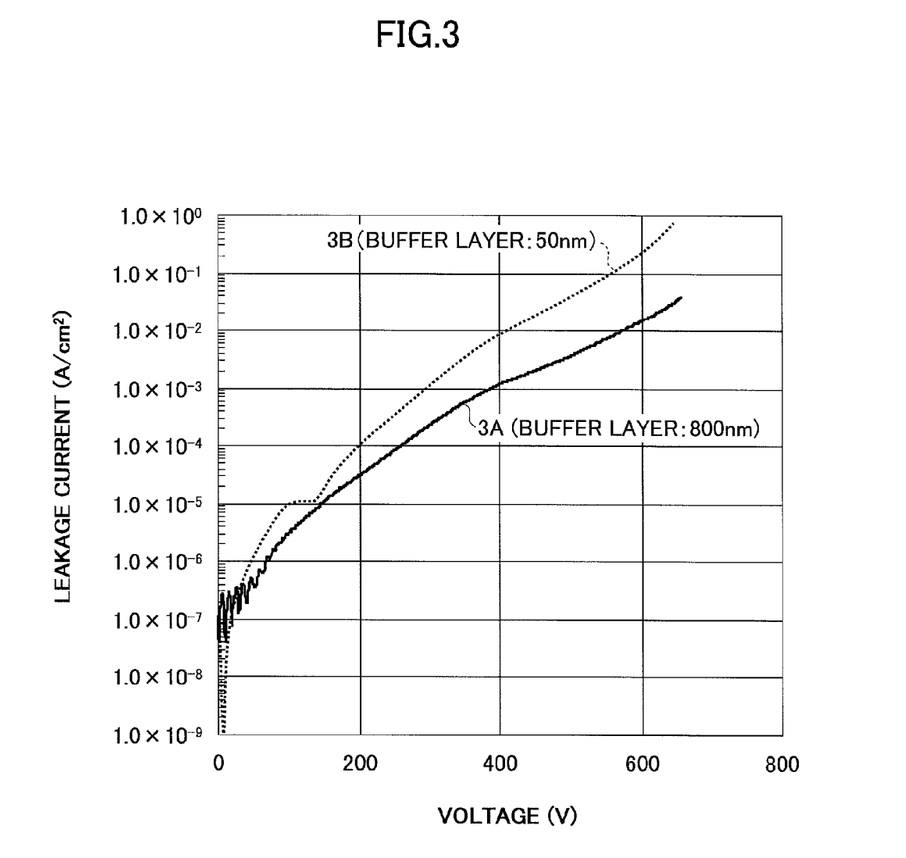
FIG. 3 is an example graph illustrating the leakage current characteristics in the substrate-gate direction.

Next, the leakage current of the semiconductor apparatus according to this embodiment is described with reference to FIG. 3. FIG. 3 is a graph illustrating a leakage current characteristic 3A of the semiconductor apparatus including the nitride layer according to this embodiment and a leakage current characteristic 3B of the semiconductor apparatus including a conventional nitride layer.

Figure 4A:
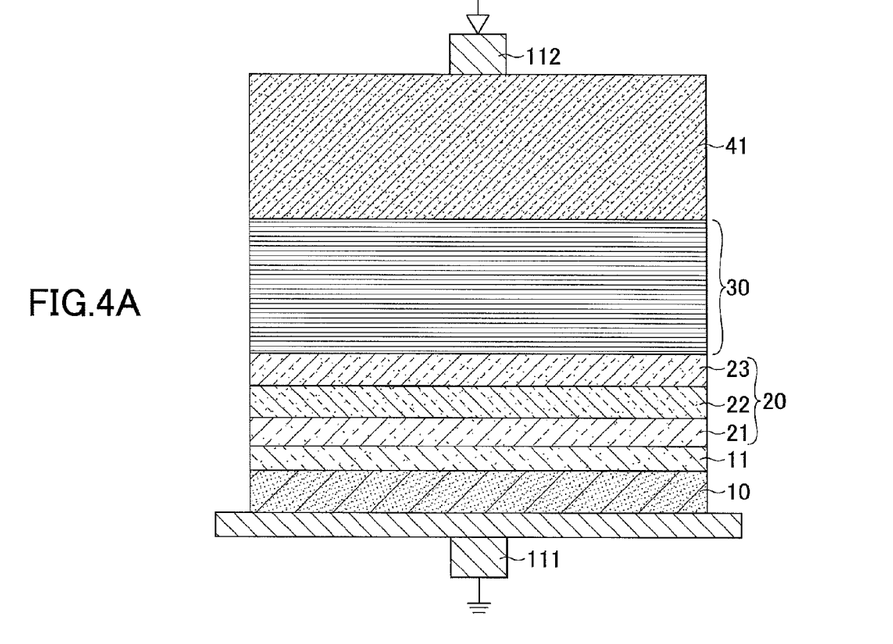
FIGS. 4A and 4B illustrate samples manufactured for acquiring the leakage current characteristics of FIG. 3.

The leakage current characteristic 3A of the semiconductor apparatus including the nitride layer according to this embodiment refers to the leakage current characteristic of the semiconductor apparatus having the layers up to the electron transit layer 41 on the substrate 10 in the semiconductor apparatus according to this embodiment as illustrated in FIG. 4A.

Specifically, the nucleation layer 11, the first buffer layer 21, the second buffer layer 22, the third buffer layer 23, the SLS buffer layer 30, and the electron transit layer 41 are formed on the substrate 10, and the leakage current is measured by contacting electrodes 111 and 112 to the rear surface of the substrate 10 and the electron transit layer 41, respectively.

Further, as the substrate 10, a silicon substrate is used, and the nucleation layer 11 is formed of an AlN layer having a thickness of 200 nm. The first buffer layer 21 is formed of an $Al_{0.8}Ga_{0.2}N$ layer having a thickness of 100 nm, the second buffer layer 22 is formed of an $Al_{0.5}Ga_{0.5}N$ layer having a thickness of 200 nm, and the third buffer layer 23 is formed of an $Al_{0.3}Ga_{0.7}N$ layer having a thickness of 500 nm.

By doing this, the total thickness of the buffer layer 20 including the first buffer layer 21, the second buffer layer 22, and the third buffer layer 23 is 800 nm.

The SLS buffer layer 30 is formed by alternately laminating the AlN layer having a thickness of 2 nm which becomes the first lattice layer 31 and the GaN layer having a thickness of 20 nm, which becomes the second lattice layer 32, for 90 cycles. By doing this, the thickness of the SLS buffer layer 30 is approximately 2,000 nm. The electron transit layer 41 is formed of a GaN layer having a thickness of 1,200 nm.

The leakage current is measured by contacting the electrodes 111 and 112 to the rear surface of the substrate 10 and the electron transit layer 41, respectively, and applying a voltage between the electrodes 111 and 112. The measurement results are indicated in the leakage current characteristic 3A of FIG. 3.

Figure 4B:
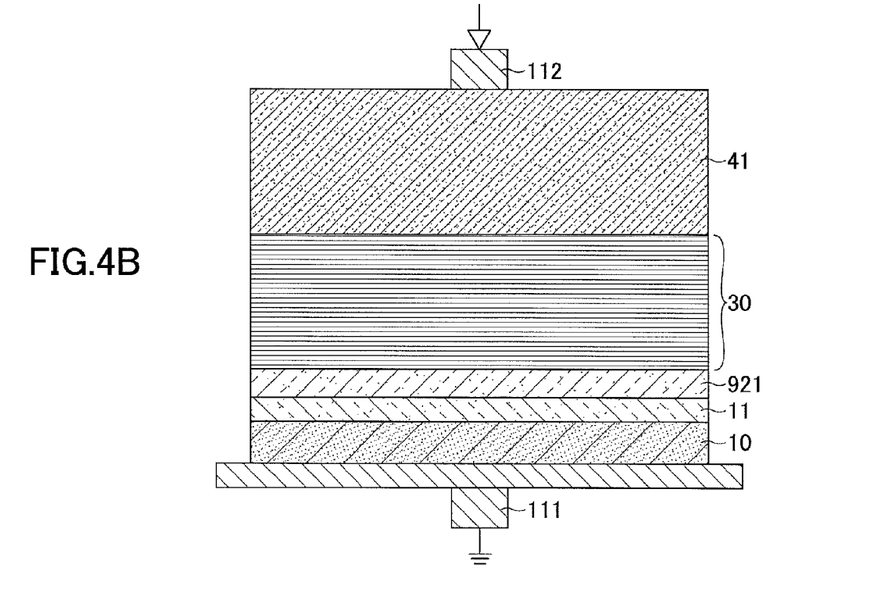

The leakage current characteristic 3B of the semiconductor apparatus including a conventional nitride layer refers to the leakage current characteristic of the semiconductor apparatus having one buffer layer 921 formed between the nucleation layer 11 and the SLS buffer layer 30 as illustrated in FIG. 4B. Specifically, the nucleation layer 11, the buffer layer 921, the SLS buffer layer 30, and the electron transit layer 41 are formed on the substrate 10, and the leakage current is measured by contacting the electrodes 111 and 112 to the rear surface of the substrate 10 and the electron transit layer 41, respectively.

The buffer layer 921 is formed of an $Al_{0.3}Ga_{0.7}N$ layer having a thickness of 50 nm. Further, the configuration of FIG. 4B is the same as that of FIG. 4A except that the buffer layer 921 is formed instead of forming the first buffer layer 21, the second buffer layer 22, and the third buffer layer 23. The leakage current is measured by contacting the electrodes 111 and 112 to the rear surface of the substrate 10 and the electron transit layer 41, respectively, and applying a voltage between the electrodes 111 and 112. The measurement results are indicated in the leakage current characteristic 3B of FIG. 3.

As illustrated in FIG. 3, the leakage current characteristic 3A of the semiconductor apparatus including the nitride layer formed according to this embodiment is lower than the leakage current characteristic 3B of the semiconductor apparatus including a conventional nitride layer at the same applied voltages. Therefore, the leakage current in the substrate-gate direction of the semiconductor apparatus according to this embodiment may be more reduced when compared with the conventional semiconductor apparatus.

Figure 5:
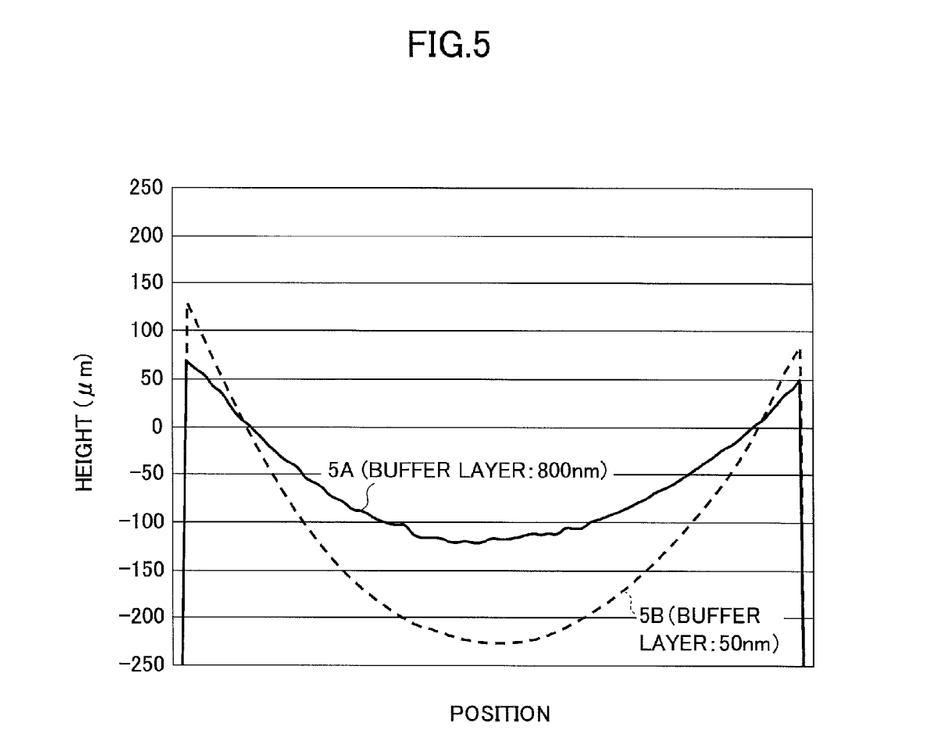
FIG. 5 is an example graph illustrating a surface state of a GaN layer.

FIG. 5 illustrates the measured bend values (i.e., changes in the height direction) of the substrate of the semiconductors in which the layers up to the electron transit layer 41 are formed on the substrate 10. FIG. 5 illustrates a surface shape 5A of the substrate in the semiconductor including the nitride layer according to this embodiment and a surface shape 5B of the substrate in the semiconductor including the conventional nitride layer.

Here, the "surface shape 5A of the substrate in the semiconductor including the nitride layer according to this embodiment" refers to the surface shape of the electron transit layer 41 in the semiconductor as illustrated in FIG. 4A except for the electrodes 111 and 112. Further, the "surface shape 5B of the substrate in the semiconductor including the conventional nitride layer" refers to the surface shape of the electron transit layer 41 in the semiconductor as illustrated in FIG. 4B except for the electrodes 111 and 112.

As illustrated in FIG. 5, a difference in height of the surface shape 5A of the substrate in the semiconductor including the nitride layer according to this embodiment is less than 200 μm. On the other hand, a difference in height of the surface shape 5B of the substrate in the semiconductor including the conventional nitride layer is approximately 350 μm.

Therefore, the bend in the semiconductor apparatus according to this embodiment may be reduced when compared with the bend in the conventional semiconductor apparatus.

Manufacturing Method of Semiconductor Apparatus

A method of manufacturing the semiconductor apparatus according to this embodiment is described with reference to FIGS. 6A and 6B.

Figure 6A:
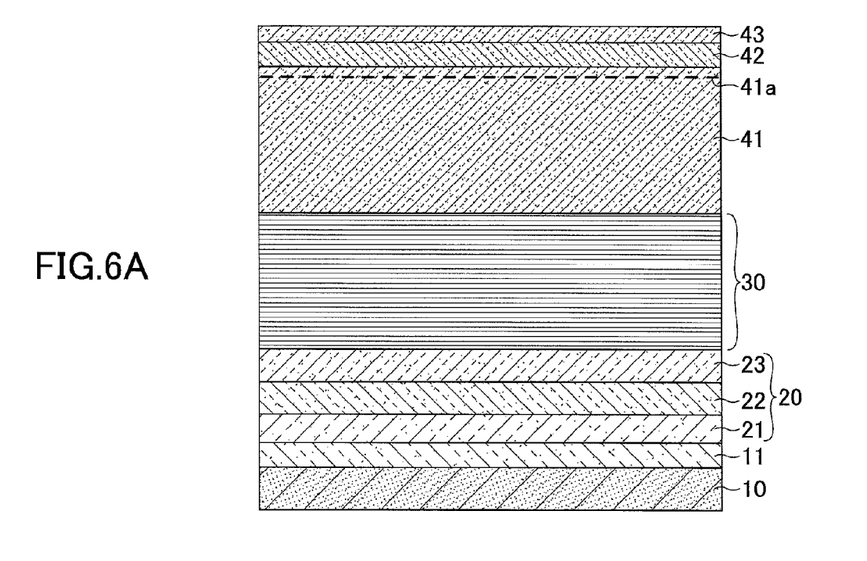
FIGS. 6A and 6B illustrate example manufacturing steps of the semiconductor apparatus according to the first embodiment.

First, as illustrated in FIG. 6A, the nucleation layer 11, the first buffer layer 21, the second buffer layer 22, the third buffer layer 23, the SLS buffer layer 30, the electron transit layer 41, the electron supply layer 42, and the cap layer 43 are sequentially and laminated and formed on the substrate 10.

Specifically, first, the substrate 10 is heated in a hydrogen atmosphere for a few minutes. After that, the nucleation layer 11, the first buffer layer 21, the second buffer layer 22, the third buffer layer 23, the SLS buffer layer 30, the electron transit layer 41, the electron supply layer 42, and the cap layer 43 are sequentially formed on the substrate 10 by the epitaxial growth using MOVPE. By doing this, the 2DEG 41a may be formed in a region of the electron transit layer 41 near the interface between the electron transit layer 41 and the electron supply layer 42.

In the epitaxial growth stage using MOVPE, as the source gas of Ga, trimethyl gallium (TMG) is used, as the source gas of Al, trimethyl aluminum (TMA) is used, and as the source gas of N, ammonia ($NH_3$) is used. Further, when Fe is injected as an impurity element, cyclopentadienyl iron, a.k.a ferrocene, (Cp2Fe) is used as the source gas of Fe. Further, when Mg is injected as an impurity element, cyclopentadienyl magnesium (Cp2Mg) is used as the source gas of Mg. Each source gas is supplied to a chamber of an MOVPE apparatus using $H_2$ as carrier gas.

The substrate 10 may be formed of sapphire, silicon (Si), silicon carbide (SiC) or the like. In this embodiment, for example, a silicon (Si) substrate is used.

The nucleation layer 11 is formed of an AlN layer having a thickness in a range from 100 nm to 200 nm.

The first buffer layer 21 is formed of an $Al_{0.8}Ga_{0.2}N$ layer having a thickness of approximately 100 nm, the second buffer layer 22 is formed of an $Al_{0.5}Ga_{0.5}N$ layer having a thickness of approximately 200 nm, and the third buffer layer 23 is formed of an $Al_{0.3}Ga_{0.7}N$ layer having a thickness of approximately 500 nm.

The SLS buffer layer 30 is formed by alternately laminating the AlN layer and the GaN layer for 100 cycles. Here, the AlN layer becomes the first lattice layer 31 and has a thickness of 5 nm, and the GaN layer becomes the second lattice layer 32 and has a thickness of 20 nm. Further, an impurity element such as Fe, Mg, C or the like may be injected into a part of the SLS buffer layer 30. In this case, when Fe or Mg is injected as an impurity element, the source gas of the impurity element is gasified by bubbling, and is supplied into a chamber of the MOVPE apparatus.

When C is injected as an impurity element, by adjusting a ratio of a supply amount of the group-III source gas such as TMG or TMA to a supply amount of the group-V source gas (V/III ratio), the concentration of C to be injected into the SLS buffer layer 30 may be adjusted. Specifically, by lowering the V/III ratio (i.e., by relatively increasing the supply amount of group-III source gas), the concentration of C in the SLS buffer layer 30 may be increased.

The electron transit layer 41 is formed of GaN so as to have a thickness in a range from 500 nm to 1,000 nm. This is because it is desired that the electron transit layer 41 has a thickness greater than or equal to a predetermined thickness to avoid the reduction of electron concentration and mobility due to dislocation or the like.

The electron transit layer 41 may be formed as a GaN film having a higher quality and a lower impurity concentration when the electron transit layer 41 is formed by epitaxial growth under the conditions that, for example, the pressure in the chamber of the MOVPE apparatus is greater than or equal to 60 kPa and the V/III ratio is greater than or equal to 10,000.

The electron supply layer 42 is formed of an AlGaN layer having a thickness of approximately 20 nm. Further, the electron supply layer 42 is formed of AlGaN having the Al composition ratio less than or equal to 0.3 so as to avoid reduction of the crystalline due to lattice mismatch.

The cap layer 43 is formed of an n-GaN layer having a thickness of approximately 5 nm.

Figure 6B:
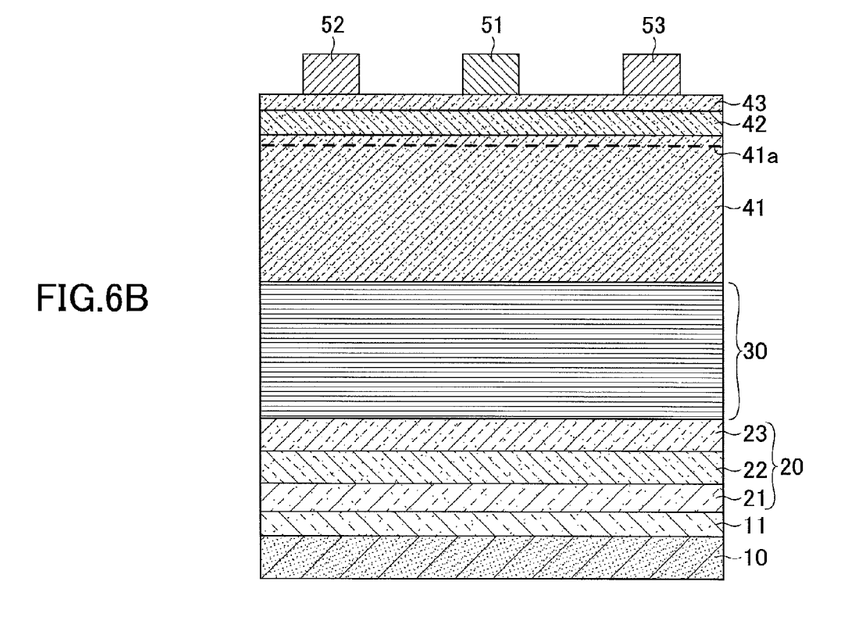

Next, as illustrated in FIG. 6B, the gate electrode 51, the source electrode 52, and the drain electrode 53 are formed on the cap layer 43.

Specifically, first, a photoresist is applied on the cap layer 43. Then, by performing an exposition and development process using an exposure device, the resist pattern is formed having openings corresponding to the regions where the source electrode 52 and the drain electrode 53 are to be formed. After that, a metal laminate film formed of Ti/Al (film thickness: Ti: 100 nm and Al: 300 nm) is formed by vacuum evaporation.

Then, the resist pattern and the metal laminate film formed on the resist pattern are dipped in organic solvent so as to be removed (lifted off). By doing this, the source electrode 52 and the drain electrode 53 are formed using the remaining metal laminate film. Then, rapid thermal anneal (RTA) is performed at a temperature of approximately 600° (Celsius) to form ohmic contact.

Further, after that, another photoresist is applied on the cap layer 43. Then, by performing the exposition and development process using the exposure device, the resist pattern is formed having an opening corresponding to a region where the gate electrode 51 is to be formed.

After that, a metal laminate film formed of Ni/Au (film thickness: Ni: 50 nm and Au: 300 nm) is formed by vacuum evaporation. Then, the resist pattern and the metal laminate film formed on the resist pattern are dipped in organic solvent so as to be removed (lifted off). By doing this, the gate electrode 51 is formed using the remaining metal laminate film.

By doing this, the semiconductor apparatus according to this embodiment may be manufactured.

Another semiconductor apparatus in this embodiment

In the above description, a case is described where the buffer layer 20 in the semiconductor apparatus in this embodiment includes the first buffer layer 21, the second buffer layer 22, and the third buffer layer 23. However, according to this embodiment, it is desired that the buffer layer 20 includes at least two AlGaN layers having compositions different from each other.

Figure 7:
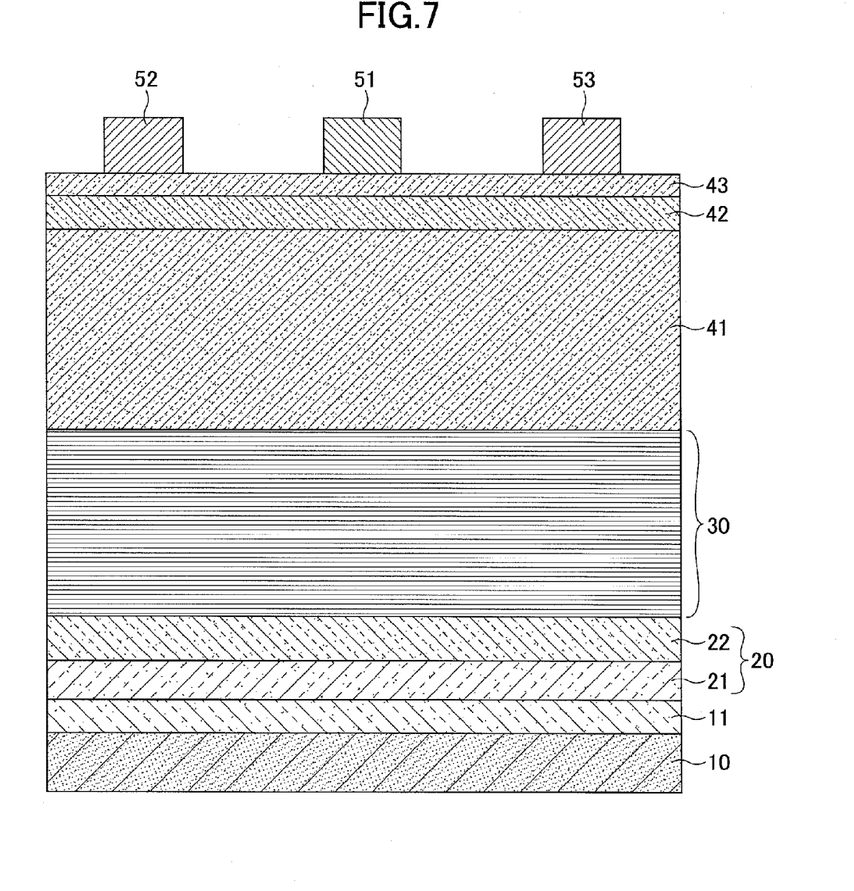
FIG. 7 illustrates an example configuration of a semiconductor apparatus according to first embodiment.

For example, as illustrated in FIG. 7, the buffer layer 20 may include only the first buffer layer 21 and the second buffer layer 22. In this case, similar to the above case, when the composition of the first buffer layer 21 is $Al_XGa_{1-X}N$ and the composition of the second buffer layer 22 is $Al_YGa_{1-Y}N$, the relationship $1>X>Y>0$ is satisfied.

Further, the buffer layer 20 may include four or more AlGaN layers having compositions different from each other. In this case, the four or more AlGaN layers having compositions different from each other are formed (arranged) from the substrate 10 side to the SLS buffer layer 30 side in the order that the Al composition ratio is increased.

Further, in this case, the buffer layer 20 is formed in a manner that the Al composition ratio in the most upper layer in the buffer layer 20 (i.e., the layer, which is included in the buffer layer 20, that is next to (in contact with) the SLS buffer layer 30) is greater than the Al effective composition ratio in the SLS buffer layer 30.

Further, the buffer layer 20 may be formed in a manner that the AlGaN layers thereof having compositions different from each other are formed (arranged) from the substrate 10 side to the SLS buffer layer 30 side in the order that the Al composition ratio is gradually decreased (i.e., the Al composition ratio is tilted). In this case as well, the Al composition ratio in the most upper layer in the buffer layer 20 is greater than the Al effective composition ratio in the SLS buffer layer 30.

Figure 8A:
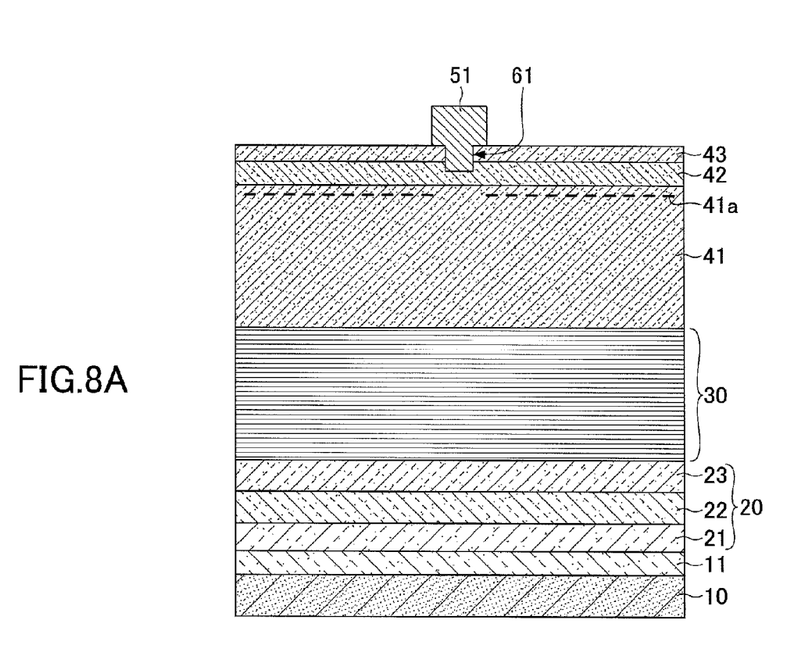
FIGS. 8A and 8B illustrate an example configuration of the semiconductor apparatus according to first embodiment.

Further, in this embodiment, as illustrated in FIG. 8A, a recess 61 may be formed just under the gate electrode 51 by removing a part of the cap layer 43 and electron supply layer 42, so that the gate electrode 51 is formed in the recess 61. By doing this, it may become possible to remove the 2DEG 41a just under the gate electrode 51 and achieve normally-off operation.

Figure 8B:
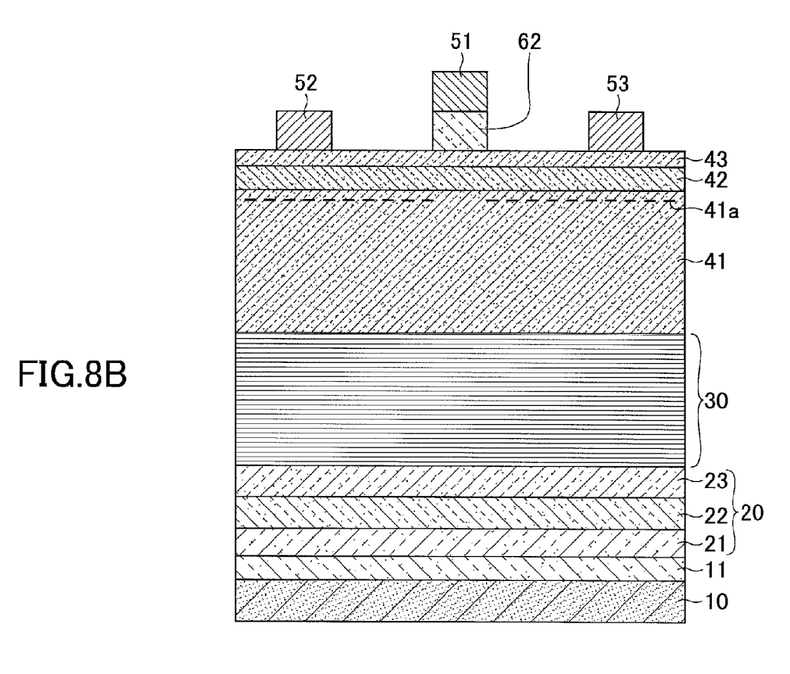

Further, as illustrated in FIG. 8B, a p-GaN layer 62 may be formed between the cap layer 43 and the gate electrode 51. By doing this, similarly, it may become possible to remove the 2DEG 41a just under the gate electrode 51 and achieve normally-off operation.

Second Embodiment

Next, a second embodiment is described. In this embodiment, a semiconductor device, a power-supply apparatus, and a high-frequency amplifier are described (provided).

Figure 9:
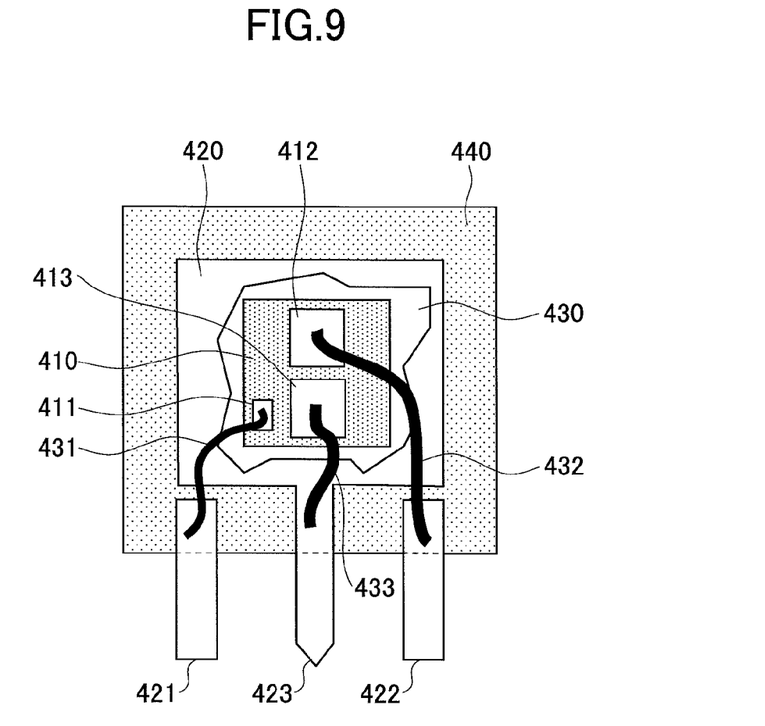
FIG. 9 illustrates a discretely-packaged semiconductor device according to a second embodiment of the present invention.

The semiconductor device in this embodiment herein refers to a discretely-packaged semiconductor apparatus according to the first embodiment. FIG. 9 schematically illustrates the inside of the discretely-packaged semiconductor apparatus. However, the arrangement of the electrodes differs from that illustrated in the figure (e.g., FIG. 1) in the first embodiment.

First, an HEMT semiconductor chip 410 using GaN-based semiconductor material is formed by cutting the semiconductor apparatus, which is manufactured according to the first embodiment, by singulation. Then the semiconductor chip 410 is fixed on a lead frame 420 with a die bonding agent such as solder. Here, the semiconductor chip 410 corresponds to the semiconductor apparatus in the first embodiment.

Next, a gate electrode 411 is connected to a gate lead 421 with a bonding wire 431, a source electrode 412 is connected to a source lead 422 with a bonding wire 432, and a drain electrode 413 is connected to a drain lead 423 with a bonding wire 433. Here, the bonding wires 431, 432, and 433 are formed of a metal material. Further, in this embodiment, the gate electrode 411 refers to the gate electrode pad which is connected to the gate electrode 51 in the semiconductor apparatus according to the first embodiment.

Similarly, the source electrode 412 refers to the source electrode pad which is connected to the source electrode 52 in the semiconductor apparatus according to the first embodiment. The drain electrode 413 refers to the drain electrode pad which is connected to the drain electrode 53 in the semiconductor apparatus according to the first embodiment.

Next, resin-sealing is performed with a mold resin 440 by the transfer mold method. By doing this, it becomes possible to manufacture the discretely-packaged semiconductor device of the HEMT using GaN-based semiconductor material.

Next, a power-supply apparatus and a high-frequency amplifier according to this embodiment are described. The power-supply apparatus and the high-frequency amplifier according to this embodiment refer to the power-supply apparatus and the high-frequency amplifier using the semiconductor apparatus according to the first embodiment.

Figure 10:
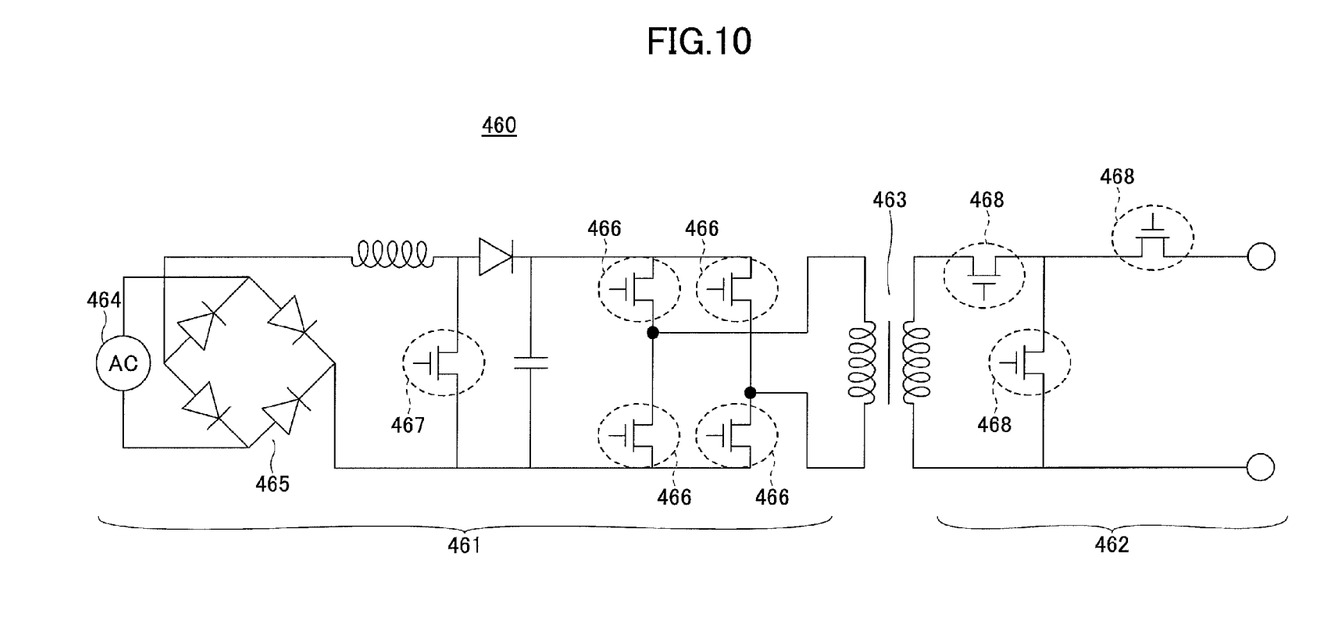
FIG. 10 illustrates an example circuit diagram of a power-supply apparatus according to the second embodiment.

First, with reference to FIG. 10, the power-supply apparatus according to this embodiment is described. The power-supply apparatus 460 includes a high-voltage primary circuit 461, a low-voltage secondary circuit 462, and a transformer 463 which is disposed between the primary circuit 461 and the secondary circuit 462.

The primary circuit 461 includes an alternating-current (AC) source 464, a so-called "bridge rectifier circuit" 465, a plurality of switching devices (four switching devices in the example of FIG. 10) 466, a single switching device 467 and the like. The secondary circuit 462 includes a plurality of switching devices (three switching devices in the example of FIG. 10) 468 and the like.

In the example of FIG. 10, the semiconductor apparatus according to the first embodiment is used as the switching devices 466 and 467. Here, it is desired that the switching devices 466 and 467 in the primary circuit 461 be normally-off semiconductors. As the switching devices 468 used in the secondary circuit 462, typical metal insulator semiconductor field effect transistors (MISFET) formed of silicon are used.

Figure 11:
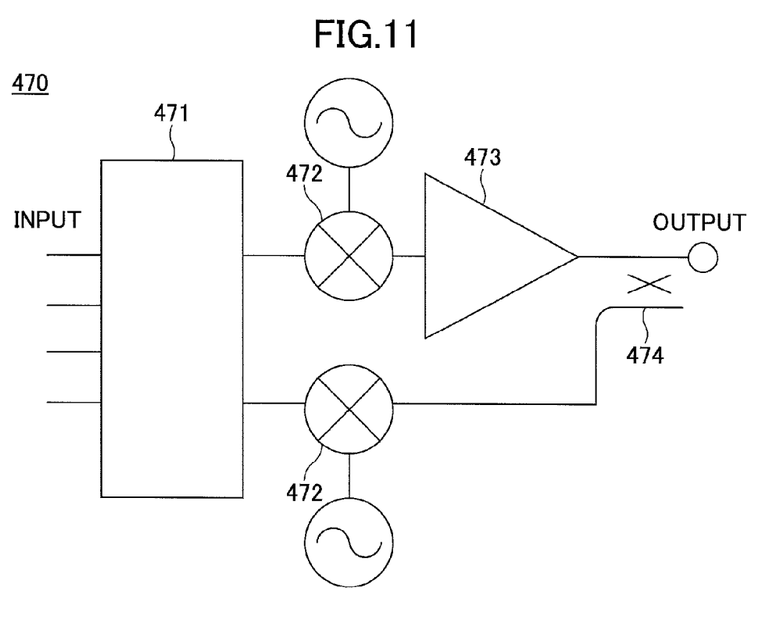
FIG. 11 illustrates an example configuration a high-power amplifier according to the second embodiment.

Next, with reference to FIG. 11, the high-frequency amplifier according to this embodiment is described. The high-frequency amplifier 470 according to this embodiment may be used as, for example, a high-power amplifier for a base station of cellular phones. The high-frequency amplifier 470 includes a digital predistortion circuit 471, a mixer 472, a power amplifier 473, and a directional coupler 474.

The digital predistortion circuit 471 compensates non-linear distortion of the input signals. The mixer 472 mixes the input signals, whose non-linear distortion has been compensated, with an AC signal. The power amplifier 473 amplifies the input signal that has been mixed with the AC signal.

In the example of FIG. 11, the power amplifier 473 includes the semiconductor apparatus according to the first embodiment. The directional coupler 474 performs monitoring on the input signal and the output signal and the like. In the circuit of FIG. 11, by a switching operation, the output signal may be mixed with the AC signal by the mixer 472 and transmitted to the digital predistortion circuit 471.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiment of the present inventions has been described in detail, it is to be understood that various changes, substitutions, and alterations could be made hereto without departing from the sprit and scope of the invention.

What is claimed is:

1. A semiconductor apparatus comprising:
   a substrate;
   a buffer layer formed on the substrate;
   an SLS (Strained Layer Superlattice) buffer layer formed on the buffer layer;
   an electron transit layer formed on the SLS buffer layer and formed of a semiconductor material; and
   an electron supply layer formed on the electron transit layer and formed of a semiconductor material;
   wherein the buffer layer includes at least three AlGaN layers with different Al composition ratios and the at least three AlGaN layers of the buffer layer are arranged in an order that the Al composition ratio decreases from a substrate side to an SLS buffer layer side, the buffer layer including a first buffer layer formed of $Al_{0.8}Ga_{0.2}N$, a second buffer layer formed of $Al_{0.5}Ga_{0.5}N$, and a third buffer layer formed of $Al_{0.3}Ga_{0.7}N$,
   wherein the SLS buffer layer is formed by alternately laminating a first lattice layer including AlN and a second lattice layer including GaN, and the second lattice layer in the SLS buffer layer, excluding the first lattice layer, is doped with an impurity element of Fe, the second lattice layer having a band gap smaller than a band gap of the first lattice layer, and
   wherein the Al composition ratio of one of the two or more AlGaN layers of the buffer layer being in contact with the SLS buffer layer is greater than or equal to an Al effective composition ratio of the SLS buffer layer.

2. The semiconductor apparatus according to claim 1, wherein a thickness of the buffer layer is greater than or equal to 500 nm and less than or equal to 1,000 nm.

3. The semiconductor apparatus according to claim 1, further comprising:
   a nucleation layer formed between the substrate and the buffer layer,
   wherein the nucleation layer is formed of AlN.

4. The semiconductor apparatus according to claim 1, wherein the buffer layer includes three layers with different Al composition ratios.

5. The semiconductor apparatus according to claim 1, wherein when a composition of the first lattice layer is expressed by $Al_R Ga_{1-R}N$ and a composition of the second lattice layer is expressed by $Al_S Ga_{1-S}N$, a formula $R>S$ is satisfied.

6. The semiconductor apparatus according to claim 1, wherein the first lattice layer is formed of AlN and the second lattice layer is formed of GaN.

7. The semiconductor apparatus according to claim 1, wherein a thickness of the first lattice layer is greater than or equal to 0.5 nm and less than or equal to 10 nm and a thickness of the second lattice layer is greater than or equal to 10 nm and less than or equal to 40 nm.

8. The semiconductor apparatus according to claim 1, wherein a ratio of a thickness of the second lattice layer to a thickness of the first lattice layer is greater than or equal to 4 and less than or equal to 20.

9. The semiconductor apparatus according to claim 1, wherein a thickness of the SLS buffer layer is greater than or equal to 1,000 nm and less than or equal to 3,000 nm.

10. The semiconductor apparatus according to claim 1, wherein a concentration of the impurity element for doping the second lattice layer in the SLS buffer layer is in a range from $1\times10^{18}$ cm$^{-3}$ to $1\times10^{20}$ cm$^{-3}$.

11. The semiconductor apparatus according to claim 1, wherein the substrate is a silicon substrate.

12. The semiconductor apparatus according to claim 1, wherein the buffer layer, the SLS buffer layer, the electron transit layer, and the electron supply layer are formed by MOVPE (Metal Organic Vapor Phase Epitaxy).

13. The semiconductor apparatus according to claim 1, wherein the electron transit layer is formed of a material including GaN.

14. The semiconductor apparatus according to claim 1, wherein the electron supply layer is formed of a material including AlGaN.

15. The semiconductor apparatus according to claim 1, wherein a gate electrode, a source electrode, and a drain electrode are formed on the electron supply layer.

16. The semiconductor apparatus according to claim 1, further comprising:
   a cap layer formed on the electron supply layer,
   wherein the cap layer is formed of a material including n-GaN.

17. A power-supply apparatus comprising:
   the semiconductor apparatus according to claim 1.

18. An amplifier comprising:
   the semiconductor apparatus according to claim 1.

* * * * *